US006507497B2

(12) United States Patent  
Mashino (10) Patent No.: US 6,507,497 B2
(45) Date of Patent: Jan. 14, 2003

(54) INTERPOSER FOR SEMICONDUCTOR, METHOD FOR MANUFACTURING THE SAME AND SEMICONDUCTOR DEVICE USING SUCH INTERPOSER

(75) Inventor: Naohiro Mashino, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 13 days.

(21) Appl. No.: 09/848,801

(22) Filed: May 4, 2001

(65) Prior Publication Data

US 2001/0040272 A1 Nov. 15, 2001

(30) Foreign Application Priority Data

May 12, 2000 (JP) ........................................ 2000-140836

(51) Int. Cl.[7] ................................................. H05K 7/06
(52) U.S. Cl. ........................ 361/767; 361/766; 361/768; 361/771; 361/782; 361/793; 361/795; 257/700; 257/701; 257/703; 257/724; 174/255; 174/262; 29/832; 29/846
(58) Field of Search ................................ 361/765–768, 361/771, 780, 783, 784, 792–795, 734, 760; 257/700–703, 723, 724; 174/255, 260, 262; 438/125; 29/832, 846, 852

(56) References Cited

U.S. PATENT DOCUMENTS

| | | | | |
|---|---|---|---|---|
| 4,574,255 A | * | 3/1986 | Fujii et al. | 331/116 R |
| 5,502,889 A | * | 4/1996 | Casson et al. | 156/52 |
| 5,854,534 A | * | 12/1998 | Belin et al. | 257/691 |
| 5,953,213 A | * | 9/1999 | Napierala | 174/52.1 |
| 6,052,287 A | * | 4/2000 | Palmer et al. | 174/255 |
| 6,137,167 A | * | 10/2000 | Ahn et al. | 257/208 |
| 6,333,857 B1 | * | 12/2001 | Kanbe et al. | 174/262 |
| 6,362,525 B1 | * | 3/2002 | Rahim | 257/528 |

* cited by examiner

Primary Examiner—Kamand Cuneo
Assistant Examiner—John B. Vigushin
(74) Attorney, Agent, or Firm—Paul & Paul (57) ABSTRACT

An interposer adapted to be used between a mounting board and a semiconductor chip which is to be mounted on the mounting board. The interposer having a heat-resistant insulator having first and second surfaces, the insulator being provided with a plurality of through-holes opened at the first and second surfaces; wiring patterns formed on the first and second surfaces of the insulator electrically connected to each other by means of a conductor provided on an inner wall of at least one of the through-holes; and a capacitor. The capacitor has first electrode formed on the insulator and having a connecting portion formed on an inner wall of at least one of the other through-holes, a dielectric layer formed on the first electrode, and a second electrode formed on the dielectric layer.

11 Claims, 8 Drawing Sheets

INTERPOSER FOR SEMICONDUCTOR, METHOD FOR MANUFACTURING THE SAME AND SEMICONDUCTOR DEVICE USING SUCH INTERPOSER

BACKGROUND OF THE INVENTION

1. Field of the Invention

The present invention relates to an interposer for a semiconductor device, a method for producing the same and a semiconductor device including the same.

2. Description of the Related Art

Capacitors are attached, for absorbing noise, to a multilayered circuit board carrying semiconductor chips. In the prior art, chip capacitors are attached to the exterior of the multilayered circuit board for this purpose.

However, the provision of the chip capacitors in the exterior of the multilayered circuit board is problematic in that the distance between the semiconductor chips and the chip capacitors is lengthened to deteriorate the noise absorbing capacity thereof, as decoupling capacitors, and the number of steps, for mounting a plurality of chip capacitors, is increased to increase the production cost. Also, there is a problem that the total size of a device which includes the chip capacitors is large.

SUMMARY OF THE INVENTION

The present invention has been made to solve the above problems in the prior art, and an object thereof is to provide an interposer for a semiconductor device excellent in noise absorbing capacity, small in size and low in production cost, a method for producing the same and a semiconductor device using the same.

According to the present invention, there is provided an interposer adapted to be used between a mounting board and a semiconductor chip which is to be mounted on the mounting board, the interposer comprising: a heat-resistant insulator having first and second surfaces, the insulator being provided with a plurality of through-holes opened at the first and second surfaces; wiring patterns formed on the first and second surfaces of the insulator electrically connected to each other by means of a conductor provided on an inner wall of at least one of the through-holes; and a capacitor comprising first electrode formed on the insulator and having a connecting portion formed on an inner wall of at least one of the other through-holes, a dielectric layer formed on the first electrode, and a second electrode formed on the dielectric layer.

Thus, the interposer of this invention incorporates a capacitor which can be located near to and directly below the semiconductor chip. Therefore, the capacitor can very effectively act as a decoupling capacitor.

Also, a plurality of capacitors can be made at the same time when the interposer is manufactured, so that the production cost can be reduced.

Also, a wiring pattern is patterned again on the interposer, so that a fine pattern can be formed. Therefore, due to such a rewiring pattern, it is possible to reduce one of the layers of the mounting board which constitutes a multi-layered board.

The capacitor is arranged on the insulator and in a vacant area between the wiring patterns. Thus, a plurality of capacitors can be formed utilizing vacant areas between the wiring patterns.

The interposer further comprises connecting bumps on the wiring patterns and on the second electrode, the connecting bumps being used for electrically connecting the interposer to the mounting board.

The insulator is made of silicon, glass, or a heat-resistant polyimide.

The capacitor comprises the first electrode formed on at least one of the first and second surfaces of the insulator, and the dielectric layer formed on the first electrode and the second electrode formed the dielectric layer. Thus, the opposing areas of the first and second electrodes can be enlarged, so that capacity of the capacitor can be increased.

According to another aspect of the present invention, there is provided a method of manufacturing an interposer adapted to be used between a mounting board and a semiconductor chip which is to be mounted on the mounting board, the method comprising: a step for forming a plurality of through-holes in a heat-resistant insulator having first and second surfaces, so that the through-holes are opened at the first and second surfaces; a step for forming a first conductor layer on the first and second surfaces and the inner walls of the through holes of the insulator; a step for patterning the first conductor layer to form wiring patterns on the first and second surfaces of the insulator and electrically connected to each other by means of the first conductor provided on the inner wall of at least one of the through-holes and to form a first electrode on the insulator so that the first electrode is electrically connected to the first conductor formed on the inner wall of at least one of the other through-holes; a step for forming a dielectric layer to cover the first electrode and the wiring pattern; a step for patterning the dielectric layer to form the dielectric layer on the first electrode; a step for forming a second conductor layer on the insulator to cover the dielectric layer; a step for patterning the second conductor layer to form a second electrode on the dielectric layer.

Thus, a plurality of capacitors can be made at the same time when the interposer is manufactured, so that the production cost can be reduced.

According to still further aspect of the present invention, there is provided a semiconductor device comprising: a mounting board; a semiconductor chip mounted on the mounting board by means of an interposer disposed therebetween, so that predetermined portions of the semiconductor chip are electrically connected to the mounting board through the interposer. The interposer has the construction mentioned above.

BRIEF DESCRIPTION OF THE DRAWINGS

FIGS. 1 to 4 are cross-sectional views illustrating a process for manufacturing an interposer of this invention, wherein

DETAILED DESCRIPTION OF THE PREFERRED EMBODIMENTS

The preferred embodiments of the present invention will be described in more detail below with reference to the attached drawings.

An interposer will be described together with a method for producing the same.

Figure 1:
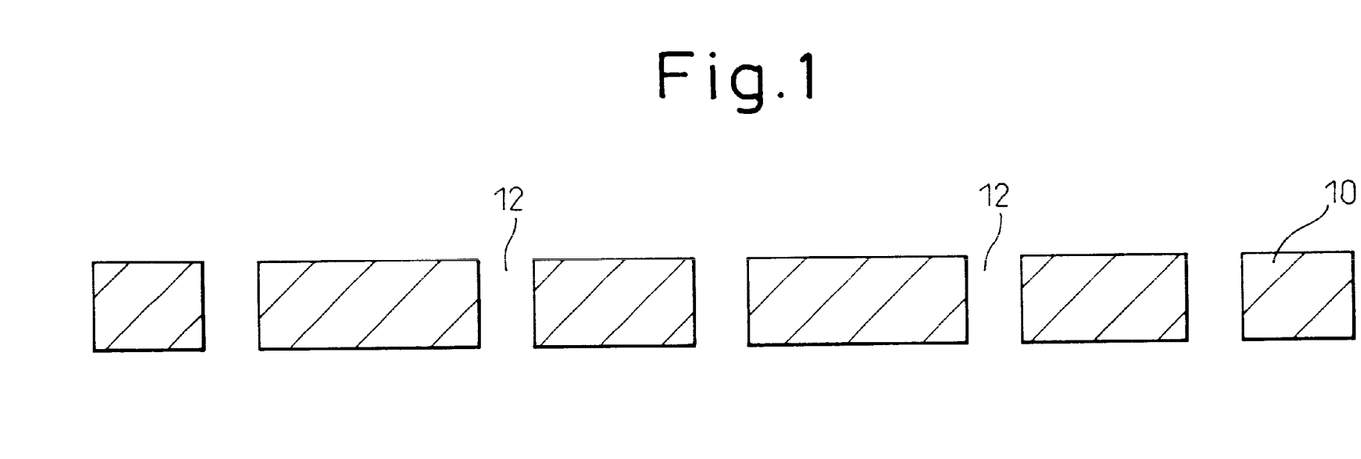
FIG. 1 illustrates a state of an insulator provided with through-holes.

FIG. 1 illustrates a plate-like insulator 10.

A plurality of through-holes 12 having a diameter in a range from 30 to 300 μm are provided in the insulator 10 at a predetermined pattern by a YAG laser or an excimer laser.

Since a heat load is applied during the sputtering as described later, the insulator 10 must be heat-resistant. For example, a polished flat silicon substrate of 50 μm thick is preferably used as the insulator 10.

Alternatively, the insulator 10 may be glass or a heat-resistant polyimide resin. A glass substrate is preferable because of its surface smoothness. When a glass substrate is used as an insulator 10, it is preferable to polish the substrate to obtain a smooth and flat surface thereof and to make a thin substrate.

When glass is used as the insulator 10, the through-holes 12 may be provided by an etching method while using a mask, or by a sand blasting method while using a mask.

As the insulator 10, a silicon substrate or a glass substrate is more preferable than a resin substrate, such as made of polyimide, because the surface thereof can advantageously be made smooth and flat.

After that, sputtering and then electrolytic plating are carried out to form a first conductor layer (not shown) of copper, aluminum or others on front and back surfaces of the insulator 10, including inner walls of the through-holes 12.

A silicon substrate polished to have a mirror surface is favorably used when the first conductor layer is formed (particularly when a sputtering film is formed) because a first conductor layer of an extremely uniform thickness and free from irregularity can be formed.

Figure 2:
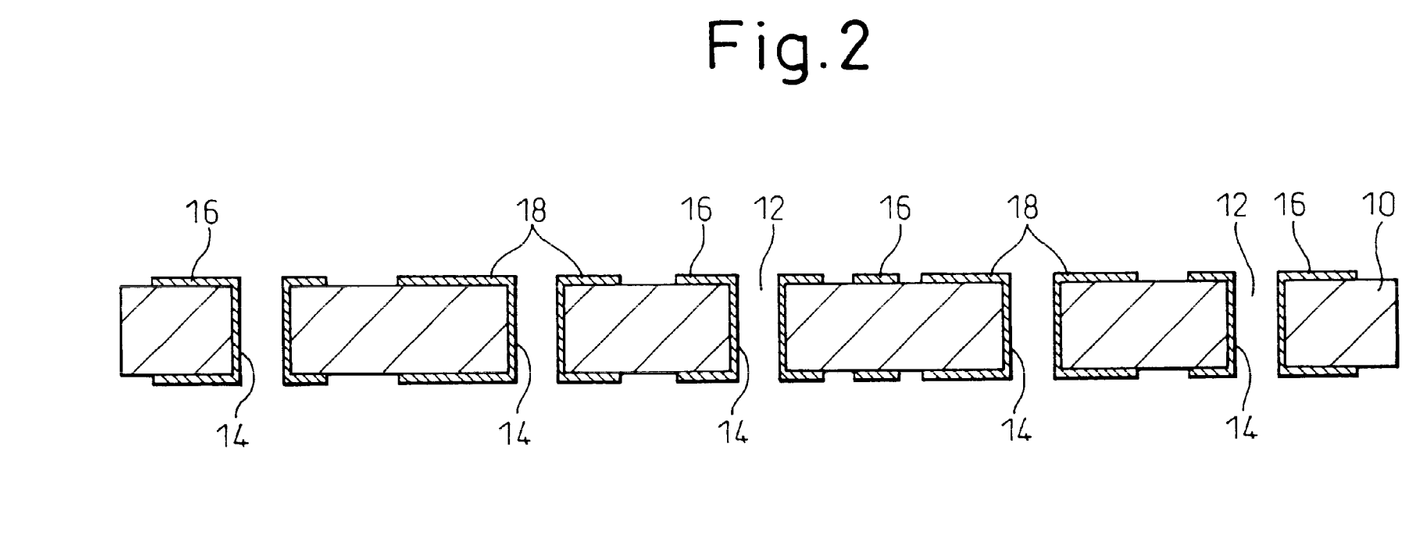
FIG. 2 illustrates a state that wiring patterns and first electrodes are formed.

Then, as shown in FIG. 2, the first conductor layer is patterned by a lithographic method to form wiring patterns 16 electrically connected to each other via conductor portions 14 formed in inner walls of some of the through-holes 12 and also to form first electrodes 18 electrically connected to each other via conductor portions 14 formed in inner walls of some of the through-holes 12.

Next, a dielectric layer 20 is formed on the surfaces of the insulator 10 and covering the wiring patterns 16 and the electrodes 18. Such a dielectric layer 2 can be formed by a sputtering process.

Figure 3:
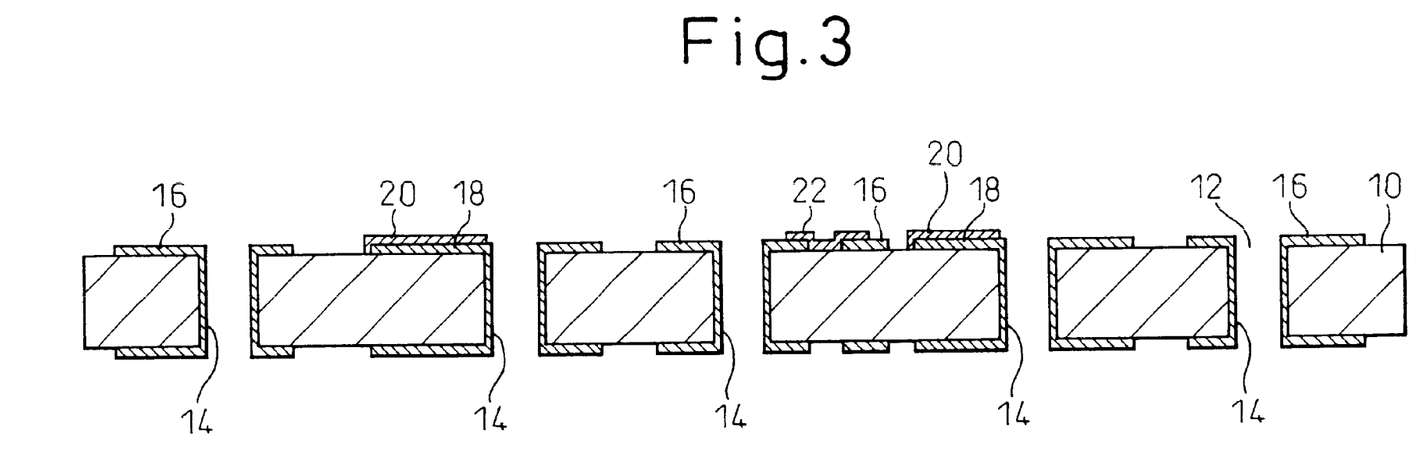
FIG. 3 illustrates a state that dielectric layers are formed.

Thereafter, the dielectric layer 20 is patterned to leave predetermined patterns on the first electrodes 18.

The dielectric layer 20 is formed preferably of a ferroelectric substance, such as STO (strontium titanium oxide) or PZT (lead zirconium titanium) and therefore a capacitor having a high capacity is obtainable.

The thinner the dielectric layer 20, the larger the capacity of the capacitor. Since the underlayer, i.e., the first electrode 18 formed by patterning the first conductor layer, has a smooth surface having no irregularity as described above, it is possible to obtain a favorable dielectric layer 20 which is thin but free from defects such as pin holes or others.

As shown in FIG. 3, if the dielectric layer is left to connect adjacent wiring patterns 16 with each other, the dielectric layer can be used as a resistor 22.

Then, a second conductor layer (not shown) is formed on the surfaces of the insulator 10 while covering the dielectric layer 20 by sputtering or electrolytic plating.

Figure 4:
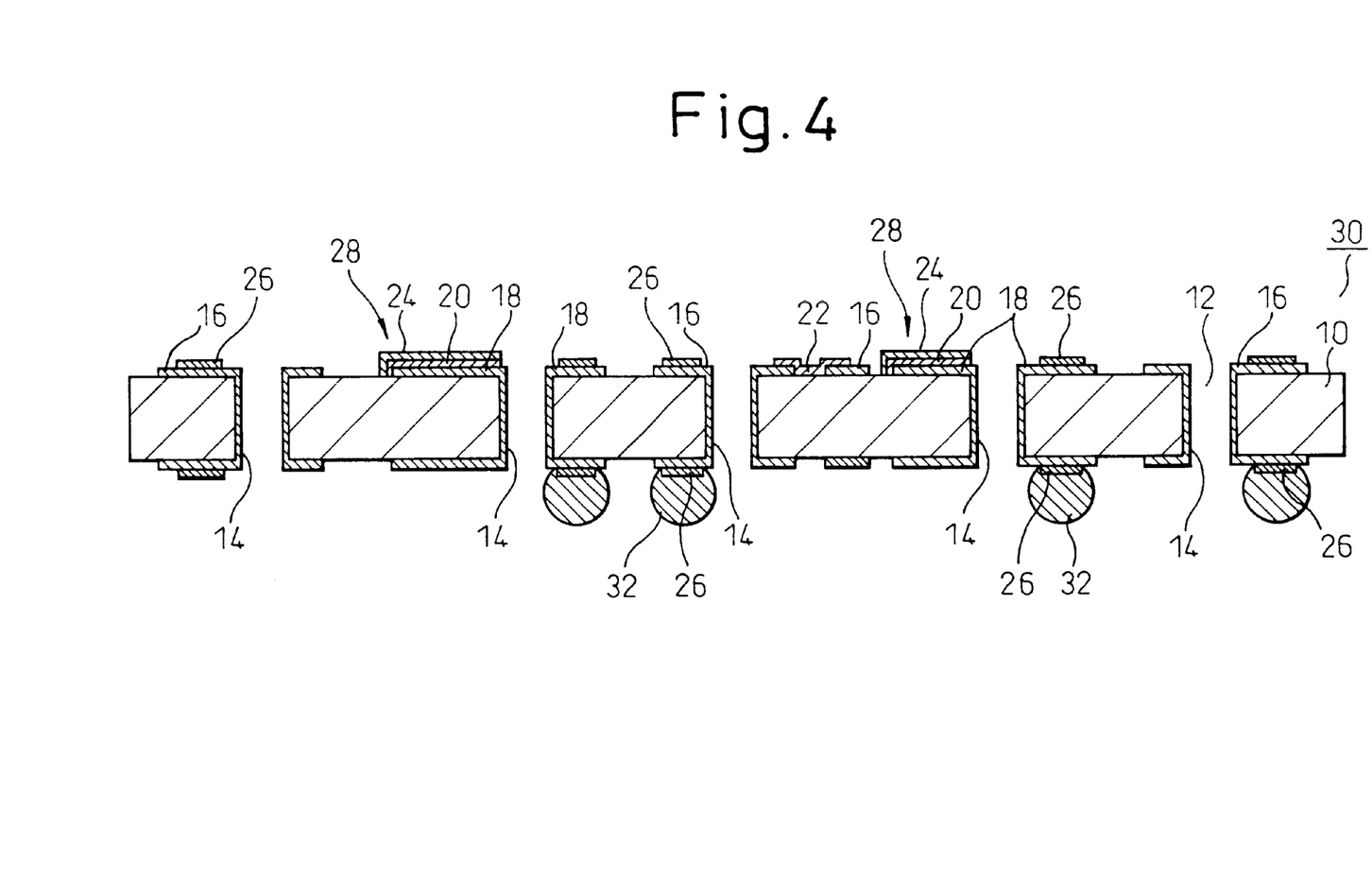
FIG. 4 illustrates a state that second electrode layers are formed.

Next, as shown in FIG. 4, the second conductor layer is patterned by a lithographic method so that second electrodes 24 are formed on the dielectric layer 20.

Thereafter, gold pads 26 are formed on the necessary portions of the wiring patterns 16, first electrodes 18 and second electrodes 24. The gold pads 26 can preferably be formed by plating or sputtering. Thus, an interposer 30 is completed. In this regard, the gold pads 26 are not indispensable.

The interposer 30 has a necessary number of capacitors 28 consisting of the first electrode 18, the dielectric layer 20 and the second electrode 24.

This interposer 30 may have solder bumps 32 on the gold pads 26 provided on a side to be mounted to a circuit board.

Figure 5:
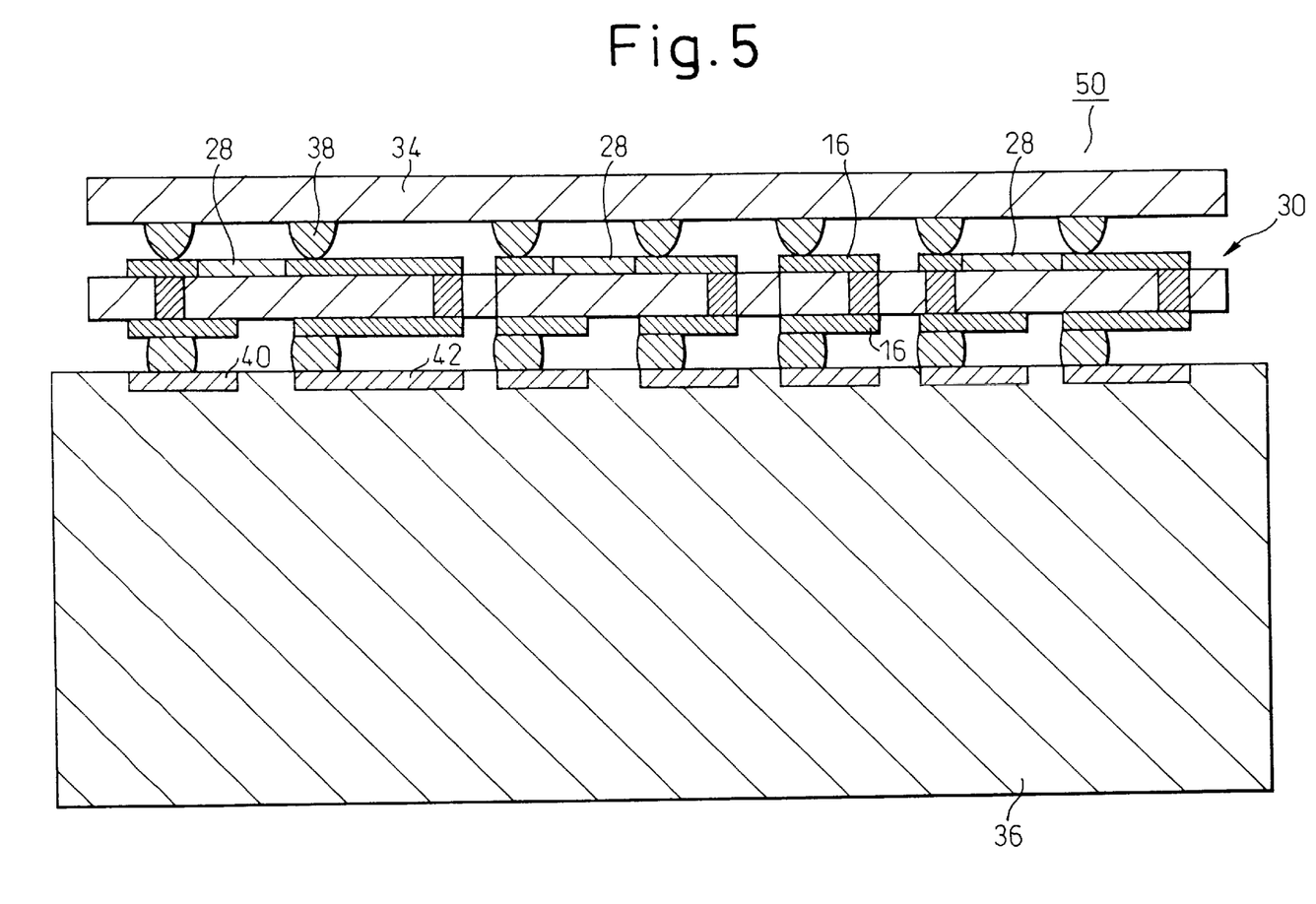
FIG. 5 is schematic cross-sectional view of a semiconductor device.

FIG. 5 schematically illustrates a semiconductor device 50 in which a semiconductor chip 34 is mounted to a circuit board 36 (including a package for the semiconductor device) via the interposer 30.

Reference numeral 38 denotes connecting bumps provided on the semiconductor chip 34; 40 denotes a power source line; and 42 denotes a ground line.

As described above, according to this embodiment, since the capacitors 28 incorporated in the interposer 30 are located directly beneath the semiconductor chip 34 and extremely close thereto, it functions well as a decoupling capacitor.

Also, since a plurality of capacitors 28 are incorporated into the interposer 30 together with the resistors 22 at the same time as the interposer 30 is manufactured, the production cost can be reduced.

If the capacitor 28 is unnecessary, the semiconductor chip 34 may be directly mounted onto the circuit board 36.

Since the wiring patterns 16 are laid out again on the interposer 30, fine patterns are obtainable. Also, due to this re-layout of the wiring pattern, it is substantially possible to reduce one of the layers of the mount board 36 which constitutes a multilayered substrate.

This embodiment has an advantage in that a number of capacitors 28 can be formed in a vacant space between the wiring patterns 16.

Figure 6:
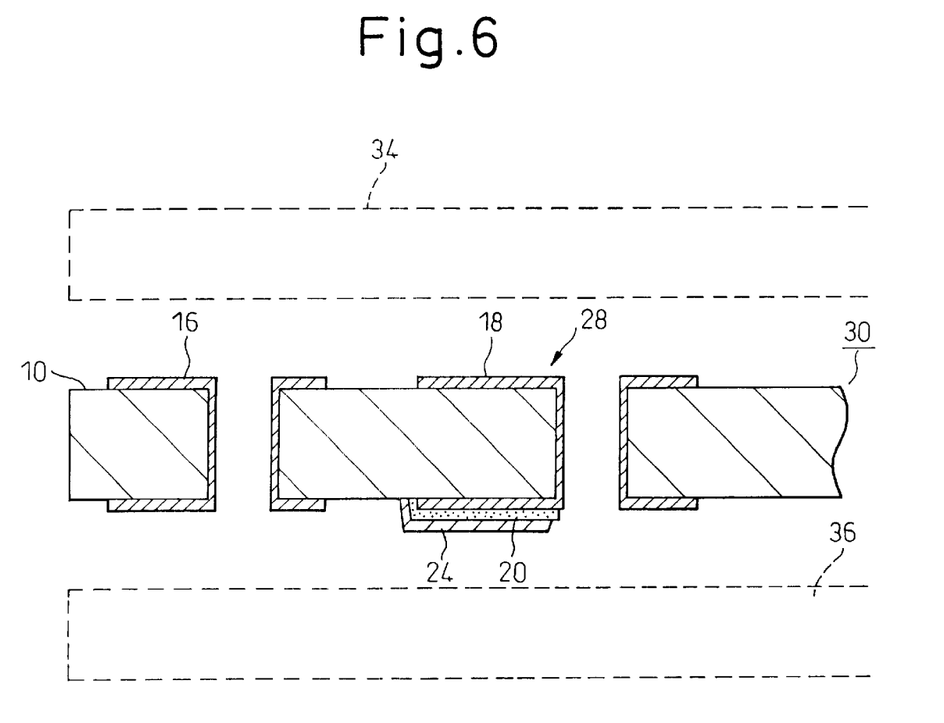
FIG. 6 illustrates another embodiment of an interposer of this invention.

While the capacitors 28 are formed on a surface of the interposer 30 closer to the semiconductor chip 34 to be mounted in the embodiment described above, the capacitor 28 may be formed on a surface closer to the circuit board 36 as in another embodiment shown in FIG. 6 wherein the same reference numerals are used for denoting the same or corresponding parts.

This interposer may be manufactured in the same process as described above.

Figure 7:
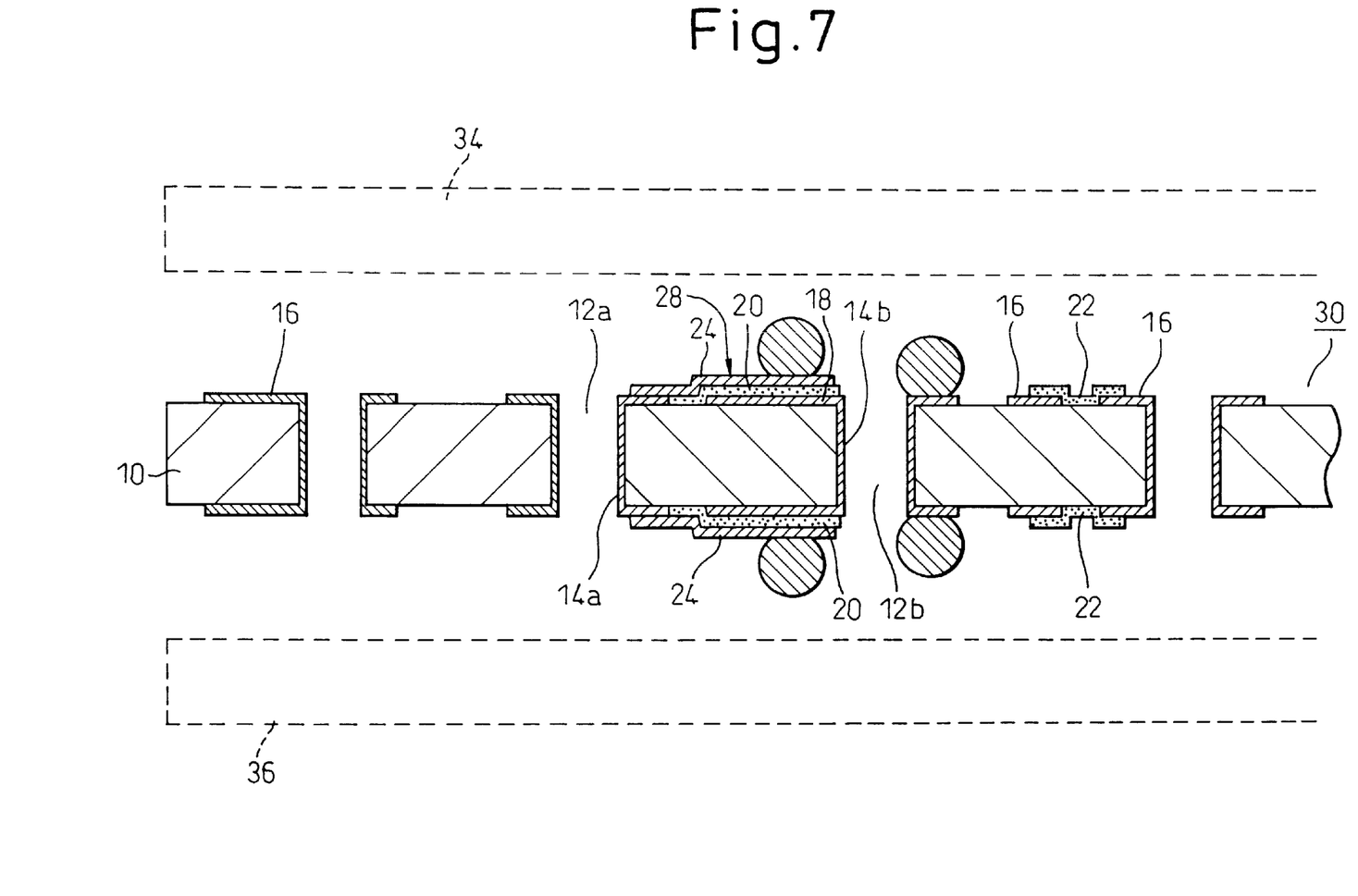
FIG. 7 illustrates still another embodiment of an interposer of this invention.

A further embodiment of the present invention is shown in FIG. 7 wherein the same reference numerals are used for denoting the same or corresponding parts.

According to this embodiment, dielectric layers 20, 20 are formed on first electrodes 18 provided on front and back surfaces of an insulator 10. On both the dielectric layers 20, 20 are formed second electrodes 24, 24 which are connected to each other via a conductor portion 14a formed in an inner wall of a through-hole 12a. The first electrodes 18 formed on the front and back surfaces of the insulator 10 are connected to each other via a conductor portion 14b formed in an inner wall of a through-hole 12b.

According to this embodiment, areas of both the electrodes 18, 24 of the capacitor 28 opposed to each other become larger to increase the capacity of the capacitor 28 to result in an interposer excellent in electric characteristics.

This interposer is also manufactured by the same process as described above because the dielectric layers 20 and the second conductor layers 24 are formed on the respective front and back surfaces of the insulator 10.

Figure 8:
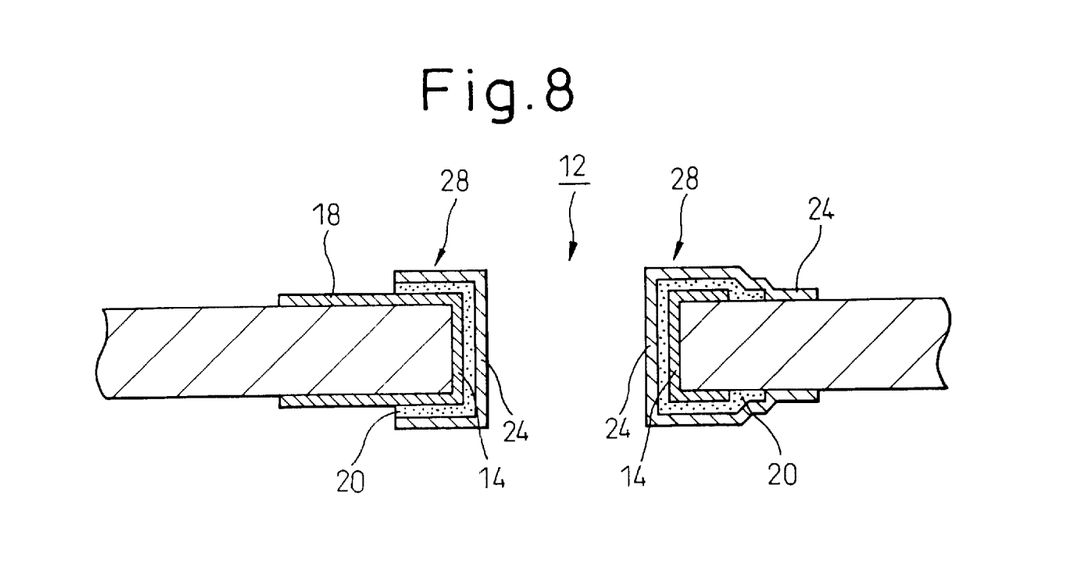
FIG. 8 illustrates a still further embodiment of an interposer of this invention.

A further embodiment is shown in FIG. 8 wherein a dielectric layer 20 is provided also in the interior of a through-hole 12 to cover a conductor portion 14 connecting first electrodes 18 formed on front and back surfaces of the insulator 10 with each other, and second electrodes 24 are provided to cover all of the dielectric layer 20.

In this embodiment, areas of both the first and second electrodes 18, 24 opposed to each other become larger to increase the capacity of the capacitor 28. Since the capacitor is formed in the through-hole, it is unnecessary to provide a capacitor on the surface of the interposer. Thus, an increase in wiring density of the interposer as well as a reduction in the size of the interposer are achievable.

In FIG. 8, the same reference numerals are used for denoting the same or corresponding parts.

It should be understood by those skilled in the art that the foregoing description relates to only some of the preferred embodiments of the disclosed invention, and that various changes and modifications may be made to the invention without departing from the sprit and scope thereof. For example, a plurality of semiconductor chips 34 can be mounted on the interposer 30 to obtain a multi-tip module.

What is claimed is:

1. An interposer adapted to be used between a mounting board and a semiconductor chip which is to be mounted on the mounting board, the interposer comprising:

a heat-resistant insulator having first and second surfaces, the insulator being provided with a plurality of through-holes opened at the first and second surfaces;

wiring patterns formed on the first and second surfaces of the insulator electrically connected to each other by means of a conductor provided on an inner wall of at least one of the through-holes; and a capacitor comprising a first electrode formed on the insulator and having a connecting portion formed on an inner wall of at least one of the other through-holes, a dielectric layer formed on the first electrode, and a second electrode formed on the dielectric layer.

2. An interposer as set forth in claim 1, wherein the capacitor is arranged on the insulator and in a vacant area between the wiring patterns.

3. An interposer as set forth in claim 1 further comprising connecting bumps on the wiring patterns and on the second electrode, the connecting bumps being used for electrically connecting the interposer to the mounting board.

4. An interposer as set forth in claim 1, wherein the insulator is made of silicon.

5. An interposer as set forth in claim 1, wherein the insulator is made of glass.

6. An interposer as set forth in claim 1, wherein the insulator is made of a heat-resistant polyimide.

7. An interposer as set forth in claim 1, wherein the capacitor comprises the first electrode formed on at least one of the first and second surfaces of the insulator, and the dielectric layer formed on the first electrode and the second electrode formed on the dielectric layer.

8. An interposer as set forth in claim 1, wherein the capacitor comprises the first electrode, at least a part thereof being formed on the inner wall of the through-hole, the dielectric layer formed on the first electrode and the second electrode formed the dielectric layer.

9. A method of manufacturing an interposer adapted to be used between a mounting board and a semiconductor chip which is to be mounted on the mounting board, the method comprising:

a step for forming a plurality of through-holes to a heat-resistant insulator having first and second surfaces, so that the through-holes are opened at the first and second surfaces;

a step for forming a first conductor layer on the first and second surfaces and inner walls of the through holes of the insulator;

a step for patterning the first conductor layer to form wiring patterns on the first and second surfaces of the insulator electrically connected to each other by means of the first conductor provided on the inner wall of at least one of the through-holes and to form a first electrode on the insulator so that the first electrode is electrically connected to the first conductor formed on the inner wall of at least one of the other through-holes;

a step for forming a dielectric layer to cover the first electrode and the wiring pattern;

a step for patterning the dielectric layer to form the dielectric layer on the first electrode;

a step for forming a second conductor layer on the insulator to cover the dielectric layer;

a step for patterning the second conductor layer to form a second electrode on the dielectric layer.

10. A method as set forth in claim 9, the method further comprising a step of forming connecting bumps on the wiring patterns and the second electrode.

11. A semiconductor device comprising:

a mounting board;

a semiconductor chip mounted on the mounting board by means of an interposer disposed therebetween, so that predetermined portions of the semiconductor chip are electrically connected to the mounting board through the interposer, the interposer comprising:

a heat-resistant insulator having first and second surfaces, the insulator being provided with a plurality of through-holes opened at the first and second surfaces;

wiring patterns formed on the first and second surfaces of the insulator electrically connected to each other by means of a conductor provided on an inner wall of at least one of the through-holes; and a capacitor comprising a first electrode formed on the insulator and having a connecting portion formed on an inner wall of at least one of the other through-holes, a dielectric layer formed on the first electrode, and a second electrode formed on the dielectric layer.

* * * * *

UNITED STATES PATENT AND TRADEMARK OFFICE
CERTIFICATE OF CORRECTION

PATENT NO. : 6,507,497 B2
DATED : January 14, 2003
INVENTOR(S) : Naohiro Mashino It is certified that error appears in the above-identified patent and that said Letters Patent is hereby corrected as shown below:

<u>Column 6,</u>
Line 5, insert -- on -- before "the dielectric layer".

Signed and Sealed this

Third Day of June, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,507,497 B2
DATED         : January 14, 2003
INVENTOR(S)   : Naohiro Mashino It is certified that error appears in the above-identified patent and that said Letters Patent is hereby corrected as shown below:

<u>Column 6,</u>
Line 5, insert -- on -- before "the dielectric layer".

Signed and Sealed this

Seventeenth Day of June, 2003

JAMES E. ROGAN
*Director of the United States Patent and Trademark Office*